United States Patent
Khesbak et al.

(10) Patent No.: US 8,587,377 B2
(45) Date of Patent: Nov. 19, 2013

(54) APPARATUS AND METHODS FOR BIASING A POWER AMPLIFIER

(75) Inventors: Sabah Khesbak, Irvine, CA (US); San Chin, Yorba Linda, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 62 days.

(21) Appl. No.: 13/309,349

(22) Filed: Dec. 1, 2011

(65) Prior Publication Data

US 2012/0146734 A1 Jun. 14, 2012

Related U.S. Application Data

(60) Provisional application No. 61/422,484, filed on Dec. 13, 2010.

(51) Int. Cl.
 *H03G 3/30* (2006.01)
(52) U.S. Cl.
 USPC .......................................... 330/136
(58) Field of Classification Search
 USPC ........................ 330/127, 133, 136
 See application file for complete search history.

(56) References Cited

U.S. PATENT DOCUMENTS

| | | | |
|---|---|---|---|
| 6,831,517 B1 * | 12/2004 | Hedberg et al. | 330/285 |
| 7,482,869 B2 | 1/2009 | Wilson | |
| 2003/0201834 A1 | 10/2003 | Pehlke | |
| 2007/0210771 A1 | 9/2007 | Wilson et al. | |
| 2007/0273449 A1 | 11/2007 | Wilson | |
| 2007/0279019 A1 | 12/2007 | Wilson | |
| 2009/0128236 A1 | 5/2009 | Wilson | |
| 2009/0302941 A1 | 12/2009 | Wimpenny | |

FOREIGN PATENT DOCUMENTS

| | | |
|---|---|---|
| GB | 2398648 | 8/2004 |
| GB | 2409115 | 11/2006 |
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

A.A.M.S. et al. "Improving the Power Added Efficiency of FET Amplifiers Operating with Varying-Envelope Signals," IEEE Transactions on Microwave Theory and Techniques, vol. 31, No. 1, Jan. 1983, pp. 51-56.

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.

(Continued)

*Primary Examiner* — Steven J Mottola
(74) *Attorney, Agent, or Firm* — Knobbe Martens Olson & Bear LLP

(57) ABSTRACT

Apparatus and methods for biasing a power amplifier are disclosed. In one embodiment, a power amplifier system includes a power amplifier configured to amplify a radio frequency (RF) signal and a bias control circuit for generating a bias current for the power amplifier. The bias control circuit is configured to receive an envelope of the RF signal and to change an amplitude of the bias current based at least in part on the envelope.

20 Claims, 6 Drawing Sheets

(56) References Cited

OTHER PUBLICATIONS

B.C. et al. "Microwave Power Amplifier with 'Envelope Controlled' Drain Power Supply," 25th European Microwave Conference, Sep. 1995, pp. 31-35.

B.S. et al. "A High Efficiency WCDMA RF Power Amplifier With Adaptive, Dual-Mode Buck-Boost Supply and Bias-Current Control," IEEE Microwave and Wireless Components Letters, vol. 17, No. 3, Mar. 2007, pp. 238-240.

Huang et al. "A MASH Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009.

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

S.F. et al. "Joint Optimization of the Power-Added Efficiency and the Error Vector Measurement of 20-GHz pHEMT Amplifier Through a New Dynamic Bias-Control Method" IEEE Transactions on Microwave Theory and Techniques, vol. 52, No. 4, Apr. 2004, pp. 1132-1141.

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

International Search Report in PCT/US2011/064440, dated Mar. 14, 2012.

Written Opinion of the International Searching Authority in PCT/US2011/064440, dated Mar. 14, 2012.

\* cited by examiner

APPARATUS AND METHODS FOR BIASING A POWER AMPLIFIER

CROSS-REFERENCE TO RELATED APPLICATIONS

This application claims the benefit of priority under 35 U.S.C. §119(e) of U.S. Provisional Patent Application No. 61/422,484, filed Dec. 13, 2010 entitled "APPARATUS AND METHOD FOR BIASING A POWER AMPLIFIER", which is herein incorporated by reference in its entirety.

BACKGROUND

1. Field

Embodiments of the invention relate to electronic systems, and in particular, to radio frequency (RF) electronics.

2. Description of the Related Technology

Power amplifiers can be included in mobile devices to amplify a RF signal for transmission via an antenna. For example, in mobile devices having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal having a relatively low power. It can be important to manage the amplification of a RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

The power consumption of a power amplifier can be an important consideration. One technique for reducing power consumption of a power amplifier is envelope tracking, which can involve varying the voltage level of the power supply node feeding a collector of a bipolar transistor of the power amplifier in relation to the envelope of the RF signal. However, such a power supply node can feed collectors of bipolar transistors that require a relatively large current. Thus, varying the power supply of the power amplifier in relation to the envelope of the RF signal can require a relatively large envelope tracking module, which can be relatively expensive and/or can consume relatively large amounts of power.

There is a need for improved power amplifiers. Furthermore, there is a need for power amplifiers having improved power efficiency.

SUMMARY

In certain embodiments, the present disclosure relates to a power amplifier system including a power amplifier configured to amplify a radio frequency (RF) signal and a bias control circuit configured to generate a bias current for the power amplifier. The bias control circuit is further configured to receive an envelope of the RF signal and to change an amplitude of the bias current based at least in part on the envelope.

In various embodiments, the bias control circuit includes a converter for generating a reference signal using the envelope, the reference signal having a shaping that changes in relation to the envelope.

In some embodiments, the bias control circuit further includes a current mirror configured to receive the reference signal from the converter and to use the reference signal to generate the bias current. In a number of embodiments, the reference signal from the converter is configured to operate as a bias voltage for the current mirror.

In various embodiments, the current mirror includes a field effect transistor having a gate, a source and a drain and a bipolar transistor having an emitter, a base and a collector. The gate of the field-effect transistor is electrically connected to collector of the bipolar transistor and the source of the field-effect transistor is electrically connected to the base of the bipolar transistor. The collector of the bipolar transistor and the gate of the field-effect transistor are configured to receive the reference signal from the converter, and the source of the field-effect transistor is configured to generate the bias current. In several embodiments, the drain of the field-effect transistor is electrically connected to a supply voltage and the emitter of the bipolar transistor is electrically connected to a ground node.

In certain embodiments, the power amplifier system further includes a delay element for delaying the envelope received by the bias control circuit.

In some embodiments, the power amplifier system further includes an envelope generator for generating the envelope and for providing the envelope to the bias control circuit.

In accordance with a number of embodiments, the power amplifier includes a first stage and a second stage, the first stage configured to drive the second stage. In some embodiments, the bias current is used to bias the second stage of the power amplifier.

In certain embodiments, the power amplifier includes a bipolar transistor having a base configured to receive at least a portion of the bias current generated by the bias control circuit. In some embodiments, the transistor is a heterojunction bipolar transistor (HBT).

In certain embodiments, the present disclosure relates to a method for biasing in an electronic system. The method providing a power amplifier for amplifying a radio frequency (RF) signal, receiving the RF signal into the power amplifier, and generating a bias current for the power amplifier, the bias current having an amplitude that changes in relation to an envelope of the RF signal.

In some embodiments, the method further includes converting the envelope into a reference signal, the reference signal having a shaping that changes in relation to the envelope. According to a number of embodiments, the method further includes biasing a current mirror with the reference signal to generate the bias current.

In several embodiments, the method further includes delaying the envelope to control a delay between the bias current and the RF signal.

In a number of embodiments, generating the bias current for the power amplifier includes generating a base current for a bipolar transistor of the power amplifier.

In certain embodiments, the present disclosure relates to a mobile device including a power amplifier configured to amplify a radio frequency (RF) signal, a transceiver for providing the RF signal to the power amplifier, and a bias control circuit configured to generate a bias current for the power amplifier. The bias control circuit is further configured to receive an envelope of the RF signal and to change an amplitude of the bias current based at least in part on the envelope.

In various embodiments, the mobile device further includes an envelope generator for generating the envelope and for providing the envelope to the bias control circuit.

In a number of embodiments, the transceiver is configured to provide at least one of an in-phase and a quadrature signal to the envelope generator to aid in generating the envelope.

According to some embodiments, the bias control circuit includes a converter for generating a reference signal using the envelope, the reference signal having a shaping that changes in relation to the envelope.

In certain embodiments, the bias control circuit further includes a current mirror configured to receive the reference signal from the converter and to use the reference signal to generate the bias current.

In various embodiments, the reference signal from the converter is configured to operate as a bias voltage for the current mirror.

DETAILED DESCRIPTION OF EMBODIMENTS

The headings provided herein, if any, are for convenience only and do not necessarily affect the scope or meaning of the claimed invention.

Provided herein are various non-limiting examples of devices and methods for facilitating amplification of a radio frequency (RF) signal.

Figure 1:
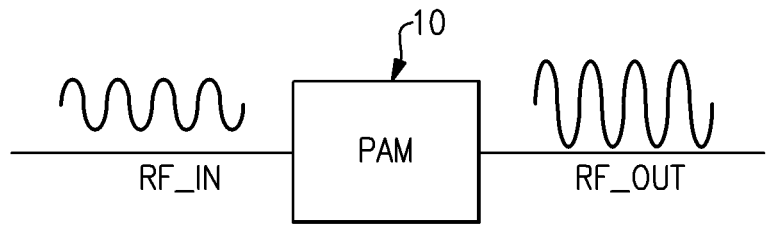
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module 10 can be configured to amplify an RF signal RF_IN to generate an amplified RF signal RF_OUT. As described herein, the power amplifier module 10 can include one or more power amplifiers.

Figure 2:
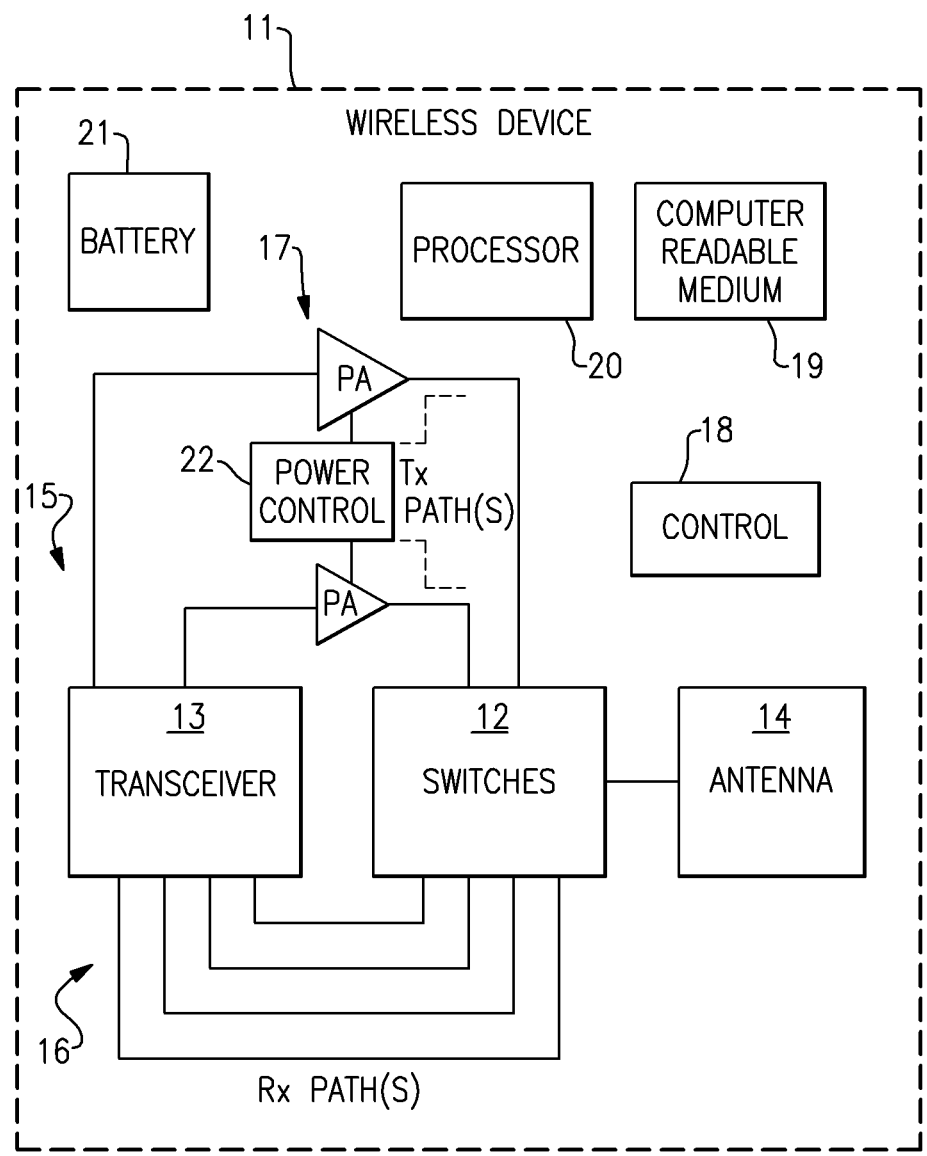
FIG. 2 is a schematic block diagram of an example wireless device that can include one or more of the power amplifier modules of FIG. 1.

FIG. 2 is a schematic block diagram of an example wireless device 11 that can include one or more of the power amplifier modules of FIG. 1. The wireless or mobile device 11 can include power amplifiers implementing one or more features of the present disclosure.

The example wireless device 11 depicted in FIG. 2 can represent a multi-band and/or multi-mode device such as a multi-band/multi-mode mobile phone. By way of examples, Enhanced Data rates for GSM Evolution (EDGE) is a mode of digital cellular communication that is utilized in many parts of the world. EDGE mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more features of the present disclosure can be implemented in the foregoing example modes and/or bands, and in other communication standards. For example, 3G, 4G, LTE, and LTE Advanced are non-limiting examples of such standards.

In certain embodiments, the wireless device 11 can include switches 12, a transceiver 13, an antenna 14, power amplifiers 17, a control component 18, a computer readable medium 19, a processor 20, a battery 21, and a power control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates the wireless device 11 as including two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 2 illustrates the wireless device 11 as including four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided, and such a component can be configured to provide various control functionalities associated with operations of the switches 12, the power amplifiers 17, the power control block 22, and/or other operating component(s). Non-limiting examples of the control component 18 are described herein in greater detail.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The illustrated wireless device 11 also includes the power control block 22, which can be used to control a power supply of the power amplifiers 17. For example, to aid in controlling the power provided to the power amplifiers 17, the power control block 22 can receive one or more signals, including, for example, signals from one or more directional couplers connected to the outputs of the power amplifiers 17. The power control block 22 can be electrically connected to a battery 21, which can be any suitable battery for use in the wireless device 11, including, for example, a lithium-ion battery.

Figure 3:
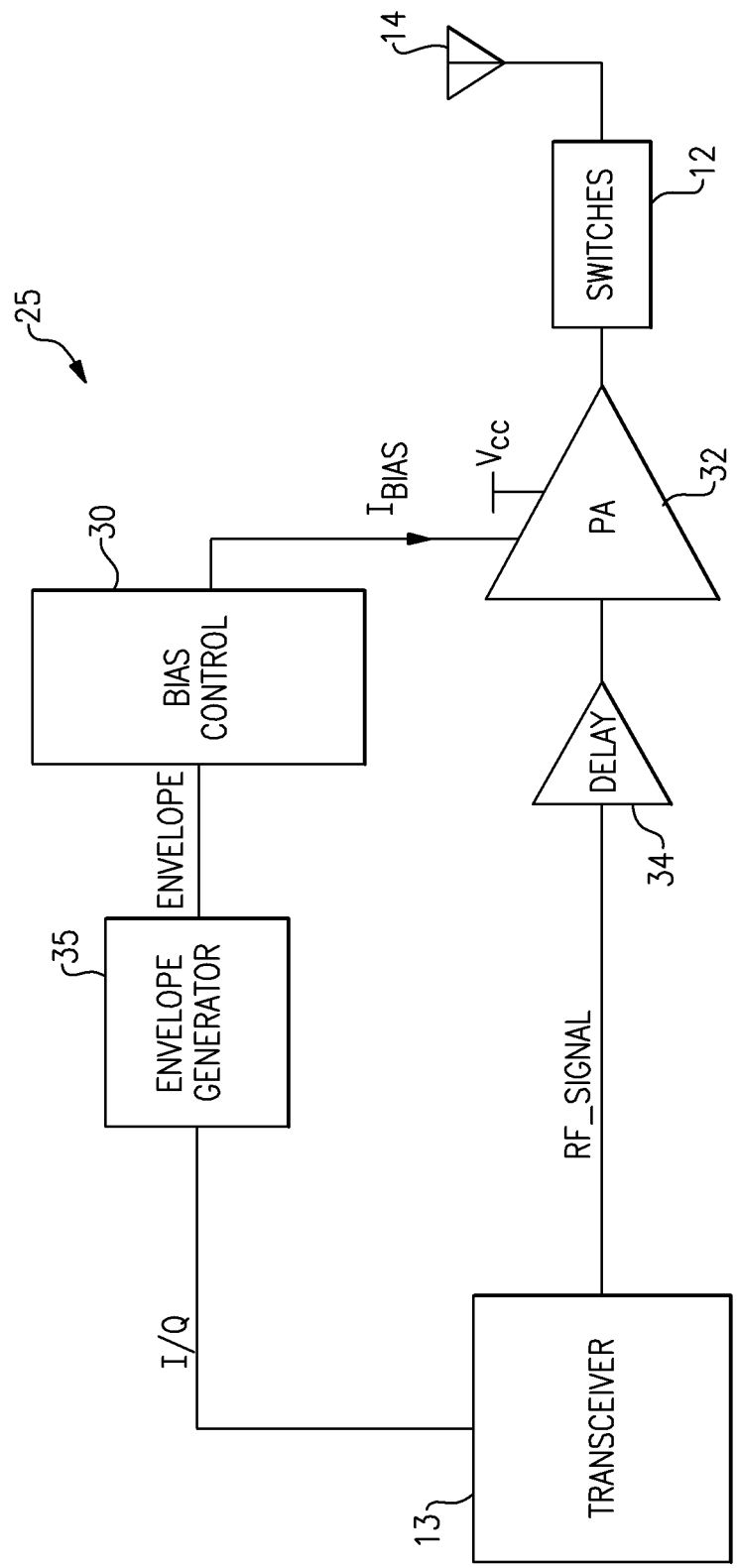
FIG. 3 is a schematic block diagram of a power amplifier system according to one embodiment.

FIG. 3 is a schematic block diagram of a power amplifier system 25 according to one embodiment. The illustrated power amplifier system 25 includes the switches 12, the transceiver 13, the antenna 14, a bias control block 30, a power amplifier 32, a delay element 34, and an envelope generator 35.

The transceiver 13 can generate a radio frequency (RF) signal RF_SIGNAL, and can provide the signal RF_SIGNAL to the delay element 34. The delay element 34 can receive the signal RF_SIGNAL, and can delay the signal RF_SIGNAL to compensate for a delay in generating a bias current $I_{BIAS}$ for the power amplifier 32. The power amplifier 32 can amplify the delayed RF signal and provide the amplified signal to an input of the switches 12, which can include a duplexer and/or other components, as was described above. The switches 12 can have an output electrically connected to the antenna 14. Although not illustrated in FIG. 3, more or fewer power amplifiers can be electrically connected to the antenna 14 and/or the transceiver 13 using the switches 12 to aid in providing desired number of transmit and/or receive paths.

The bias control block 30 can generate the bias current $I_{BIAS}$ for the power amplifier 32. The bias current $I_{BIAS}$ can be used to control the operating point of the power amplifier 32. For example, in a bipolar transistor configuration, the bias current $I_{BIAS}$ can be used to establish the collector current and/or base-emitter voltage of one or more bipolar transistors used to amplify the RF signal received by the power amplifier 32. The bias current $I_{BIAS}$ can affect the operation and performance of the power amplifier 32, including the linearity and/or power efficiency of the power amplifier 32, as will described later below.

The bias control block 30 can receive an envelope of the RF signal, and can use the envelope signal to change or vary the amplitude of the bias current $I_{BIAS}$. By changing the amplitude of the bias current $I_{BIAS}$ in relation to the envelope of the RF signal, a bias current $I_{BIAS}$ that is efficient can be provided to the power amplifier 32. For example, providing too large of a bias current as compared to a power level of the RF signal can lead to wasted power and/or increased heat dissipation. Thus, the bias control block 30 can be configured to generate a relatively large bias current $I_{BIAS}$ when the power of the RF signal amplified by the power amplifier 32 is relatively high and to generate a relatively small bias current $I_{BIAS}$ when the power of the RF signal is relatively low. By varying the bias current $I_{BIAS}$ in this manner, a bias current $I_{BIAS}$ sufficient to operate the power amplifier 32 with the desired linearity can be provided, thereby leading to improved power efficiency and reduced heat dissipation of the power amplifier system 25.

The envelope generator 35 can be used to generate the envelope of the RF signal, and can provide the envelope signal to the bias control block 30 to aid in generating the bias current $I_{BIAS}$. The transceiver 13 can provide an in-phase (I) and/or quadrature (Q) signal to the envelope generator 35 to aid the envelope generator 35 in generating the envelope signal. However, persons having ordinary skill in the art will appreciate that the envelope generator 35 need not receive the I and/or Q signal from the transceiver 13, and that any suitable technique of envelope detection can be employed.

Figure 4A:
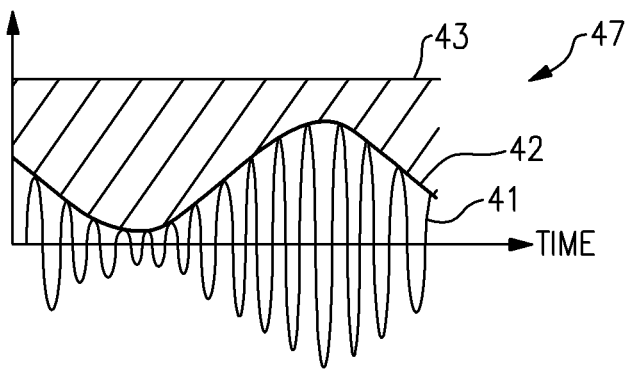
FIGS. 4A-4B show two examples of bias currents for a power amplifier versus time.
Figure 4B:
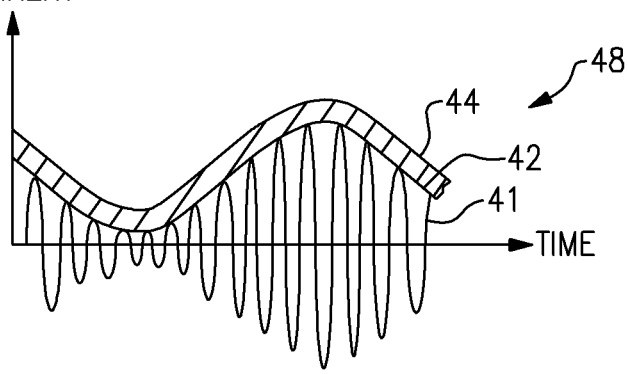

FIGS. 4A-4B show two examples of bias currents for a power amplifier versus time.

In FIG. 4A, a graph 47 illustrates an RF signal current 41 and a bias current 43 for a power amplifier versus time. The RF signal current 41 has a current envelope 42.

It can be desirable to reduce a difference between the bias current 43 and the current envelope 42, as the area between the bias current 43 and the current envelope 42 can represent lost energy, which can reduce battery life and/or increase heat generated in a wireless device.

In FIG. 4B, a graph 48 illustrates the RF signal current 41 and a bias current 44 for a power amplifier versus time. In contrast to the bias current 43 of FIG. 4A, the bias current 44 of FIG. 4B varies in relation to the current envelope 42 of the RF signal. The area between the bias current 44 and the current envelope 42 in FIG. 4B is less than the area between the bias current 43 and the current envelope 42 in FIG. 4A, and thus the graph 48 of FIG. 4B can be associated with a power amplifier system having greater energy efficiency and reduced heat dissipation relative to a power amplifier system associated with the graph 47 of FIG. 4A.

Figure 5:
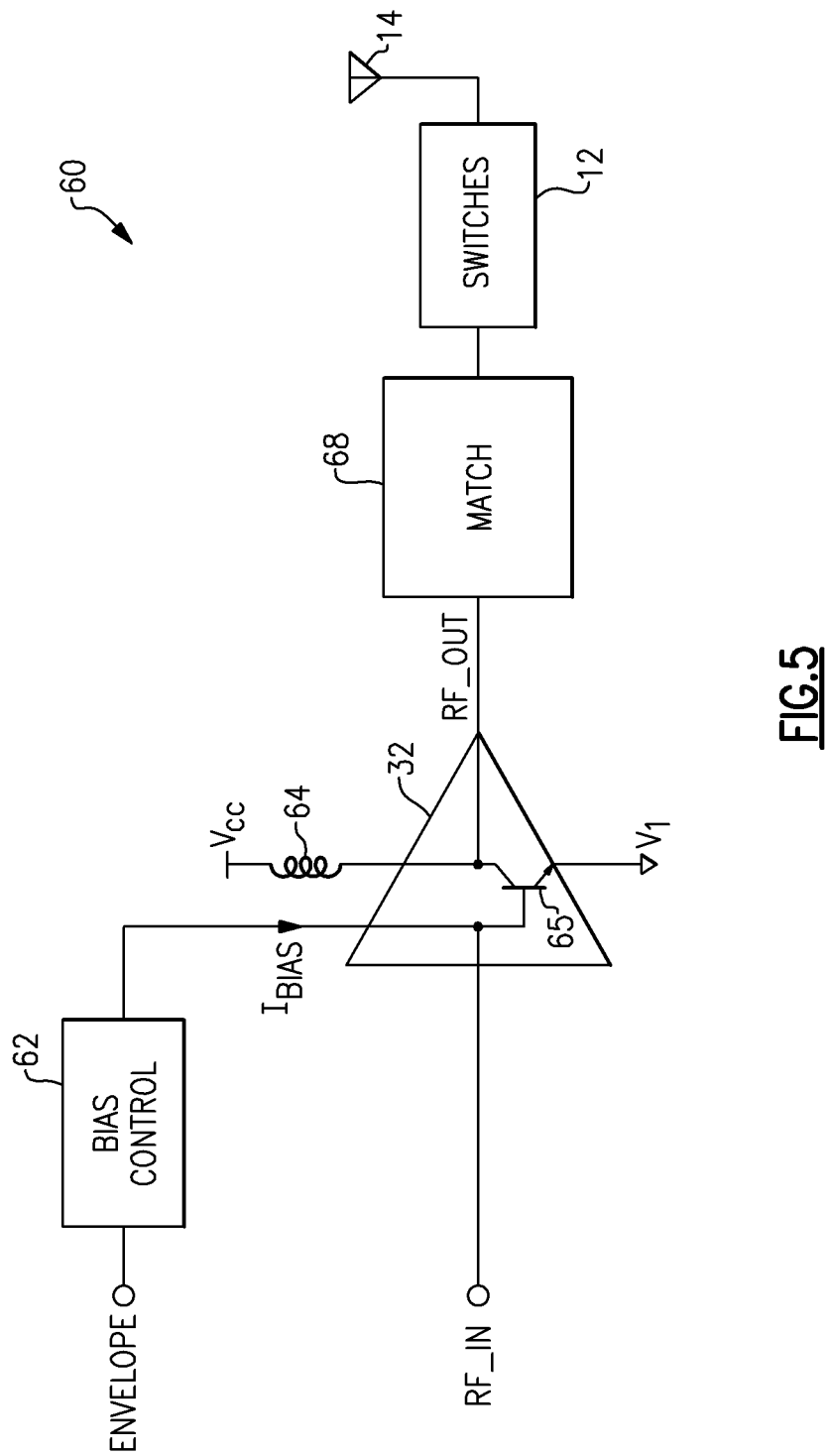
FIG. 5 is a schematic block diagram of a power amplifier system according to another embodiment.

FIG. 5 is a schematic block diagram of a power amplifier system 60 according to another embodiment. The power amplifier system 60 includes the switches 12, the antenna 14, the power amplifier 32, a bias control block 62, an inductor 64, and an impedance matching block 68.

The illustrated power amplifier 32 includes a bipolar transistor 65 having an emitter, a base, and a collector. The emitter of the bipolar transistor 65 can be electrically connected to a first voltage supply $V_1$, which can be, for example, a ground node. A radio frequency (RF) signal RF_IN can be provided to the base of the bipolar transistor 65. The bipolar transistor 65 can amplify the RF signal RF_IN to generate an amplified RF signal RF_OUT at the collector of the bipolar transistor 65. In one implementation, the bipolar transistor 65 is a heterojunction bipolar transistor (HBT). However, the bipolar transistor 65 can be any suitable device. For example, in some implementations the bipolar transistor 39 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor.

The power amplifier 32 can be configured to provide the amplified RF signal RF_OUT to the switches 12. The impedance matching block 68 can be used to aid in terminating the electrical connection between the power amplifier 32 and the switches 12. For example, the impedance matching block 68 can be used to increase power transfer and/or reduce reflections of the amplified RF signal RF_OUT.

The inductor 64 can be included to aid in electrically connecting a power amplifier supply voltage Vcc to the collector of the bipolar transistor 65. Inclusion of the inductor 64 can aid in isolating the amplified RF signal from the power amplifier supply voltage Vcc. Although not illustrated in FIG. 5 for clarity, the power amplifier system 60 can include additional components, such as bypass capacitors electrically connected between the power amplifier supply voltage Vcc and the first supply voltage $V_1$.

The bias control block 62 can generate a bias current $I_{BIAS}$ that can be provided to the base of the bipolar transistor 65 of the power amplifier 32. The bias current $I_{BIAS}$ can be used to establish, for example, the collector current and/or base-emitter voltage of the bipolar transistor 65. A bias current $I_{BIAS}$ that varies in relation to the envelope of the RF signal, a bias current $I_{BIAS}$ can be provided by the bias control block 62 to the power amplifier 32, thereby increasing energy efficiency and/or reducing heat dissipation, as was described above.

Although FIG. 5 illustrates one implementation of the power amplifier 32, skilled artisans will appreciate that the teachings described herein can be applied to a variety of power amplifier structures, including, for example, multi-stage power amplifier structures and power amplifiers employing other transistor structures. For example, the power amplifier 32 can include an additional stage which can be similar to the one shown, and the additional stage can be configured to drive the input of the illustrated power amplifier stage. The additional stage can, but need not, include a bipolar transistor that can be biased using a bias current that varies in relation to an envelope of the RF signal.

Figure 6:
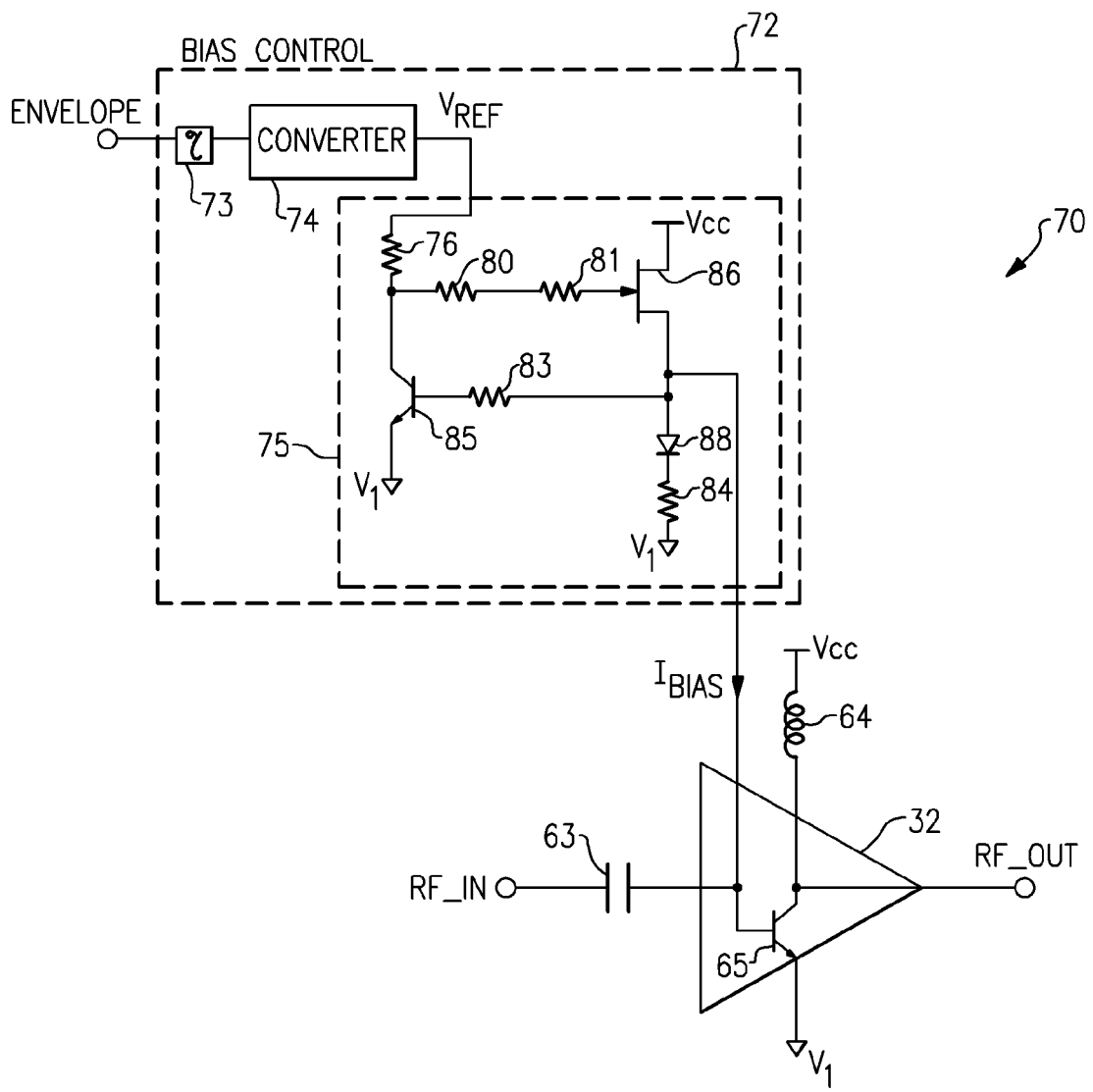
FIG. 6 is a schematic block diagram of a power amplifier system according to yet another embodiment.

FIG. 6 is a schematic block diagram of a power amplifier system 70 according to yet another embodiment. The illustrated power amplifier system 70 includes a power amplifier 32, a capacitor 63, an inductor 64, and a bias control block 72.

The power amplifier 32 can amplify an RF signal RF_IN using the bipolar transistor 65. As was described above, the bipolar transistor 65 can include an emitter, a base, and a collector. A capacitor 63 can have a first end configured to receive the RF signal RF_IN and a second end electrically connected to the base of the bipolar transistor 65, and can be used as a DC blocking capacitor to aid in biasing the bipolar transistor 65. The emitter of the bipolar transistor 65 can be connected to any suitable node, such as a first voltage supply $V_1$, and the collector of the bipolar transistor 65 can be configured to generate an amplified RF signal RF_OUT. The inductor 64 can include a first end electrically connected to a power amplifier supply voltage Vcc and a second end electrically connected to the collector of the bipolar transistor 65, and can be used to aid in isolating the amplified RF signal RF_OUT from the power amplifier supply voltage Vcc.

The bias control block 72 can receive an envelope of the RF signal, and can generate a bias current $I_{BIAS}$ for biasing the power amplifier 32. For example, as illustrated, the bias control block 72 can be electrically connected to the power amplifier 32 such that the base of the bipolar transistor 65 of the power amplifier 32 receives the bias current $I_{BIAS}$. As will be described below, the bias control block 72 can generate the bias current $I_{BIAS}$ based at least in part on the envelope signal.

The illustrated bias control block 72 includes a delay block 73, a converter 74, and a current mirror 75. The current mirror 75 includes a first resistor 76, a second resistor 80, a third resistor 81, a fourth resistor 83, a fifth resistor 84, a bipolar transistor 85, a field-effect transistor 86, and a diode 88.

The delay block 73 includes a first end configured to receive the envelope of the RF signal RF_IN, and a second end configured to generate a delayed envelope signal. The delay block 73 can be used to control a time delay between when the bias current $I_{BIAS}$ is provided to the power amplifier 32 and when the power amplifier 32 receives the RF signal RF_IN. Since the bias control block 72 is configured to change the bias current $I_{BIAS}$ in relation to the envelope signal, the delay block 73 can be used to improve the envelope bias current tracking of the bias control block 72 by improving the alignment between the bias current $I_{BIAS}$ and the RF signal RF_IN.

The converter 74 includes a first end for receiving the delayed envelope signal generated by the delay block 73 and a second end for generating a reference bias voltage $V_{REF}$. The converter 74 can be used to shape the envelope of the RF signal so as to generate a signal having electrical characteristics suitable for use as a reference bias voltage $V_{REF}$ for the current mirror 75.

The bias control block 72 can include the current mirror 75 for generating the bias current $I_{BIAS}$ using the reference bias signal $V_{REF}$ generated by the converter 74. For example, the illustrated bias control block 72 includes the first resistor 76, the second resistor 80, the third resistor 81, the fourth resistor 83, the bipolar transistor 85, and the field-effect transistor 86, which are electrically connected to form the current mirror 75 for generating the bias current $I_{BIAS}$.

The first resistor 76 includes a first end configured to receive the reference bias signal $V_{REF}$ generated by the converter 74, and a second end electrically connected to a first end of the second resistor 80 and to a collector of the bipolar transistor 85. The second resistor 80 includes a second end electrically connected to a first end of the third resistor 81. The third resistor 81 includes a second end electrically connected to the gate of the field-effect transistor 86.

The bipolar transistor 85 includes an emitter electrically connected to the first voltage supply $V_1$, and a base electrically connected to a first end of the fourth resistor 83. The fourth resistor 83 includes a second end electrically connected to the source of the field-effect transistor 86. The drain of the of the field-effect transistor 86 is electrically connected to the power supply Vcc, and the source of the field-effect transistor 86 is configured to generate the bias current $I_{BIAS}$. The diode 88 and the fifth resistor 85 have been included to aid in biasing the field-effect transistor 86. The diode 88 includes an anode electrically connected to the second end of the fourth resistor 83 and to the source of the field-effect transistor 86, and a cathode electrically connected to a first end of the fifth resistor 84. The fifth resistor 84 includes a second end electrically connected to the first voltage supply $V_1$.

The bias control block 72 can receive an envelope of the RF signal, and can use the envelope signal to change the amplitude of the bias current $I_{BIAS}$. By varying the amplitude of the bias current $I_{BIAS}$ in relation to the envelope of the RF signal, a bias current $I_{BIAS}$ that is efficient can be provided to the power amplifier 32. Thus, the bias control block 72 can be used to reduce power consumption of the power amplifier 32, thereby improving battery life and reducing heat dissipation of a wireless device, such as the wireless device 11 of FIG. 2. By adjusting various parameters of the bias control block 72, including, for example, the delay of the delay block 73, the characteristics of the reference bias signal $V_{REF}$ generated by the converter 74, and/or the characteristics of the current mirror 75, the bias control block 72 can be configured to generate a bias current $I_{BIAS}$ that can be used to reduce the power consumption of the power amplifier 32 while achieving the desired degree of linearity for the power amplifier 32.

FIG. 6 illustrates one configuration of the bias control block 72. However, persons having ordinary skill of the art will appreciate that other implementations of the bias control block 72 can be implemented in accordance with the envelope biasing schemes described herein. For example, the order of certain components, such as the delay block 73 and the converter 74, can be reversed.

Although the current mirror 75 illustrates one example of a current mirror suitable for use in the bias control block 72, other current mirror configurations can be used. For example, in some implementations, the second and/or third resistors 80, 81 can be combined into a single resistor. Additionally, in some implementations one or more of the first, second, third, fourth and/or fifth resistors 76, 80, 81, 83, 84 can be omitted. Furthermore, in some implementations the fifth resistor 84 and/or diode 86 can be omitted in favor of using an alternative structure to bias the field-effect transistor 86. Additionally, in some implementations, the bipolar transistor 85 and/or field-effect transistor 86 can be omitted in favor of using a current mirror employing a different configuration of transistors.

The bias control block 72 can be implemented on the same or a different die as the power amplifier 32. For example, the bias control block 72 and the power amplifier 32 can be manufactured on a gallium arsenide (GaAs) substrate using a bipolar field-effect transistor (BiFET) process. Thus, the bipolar transistors 65, 85 can be, for example, heterojunction bipolar transistor (HBT) devices, and the field-effect transistor 86 can be, for example, a pseudomorphic high electron mobility transistor (pHEMT) device. Alternatively, the bias control block 72 and the power amplifier 32 can be manufactured on separate dies, and can be included, for example, as part of a multi-chip module (MCM) or as separate components on a phone board.

Figure 7:
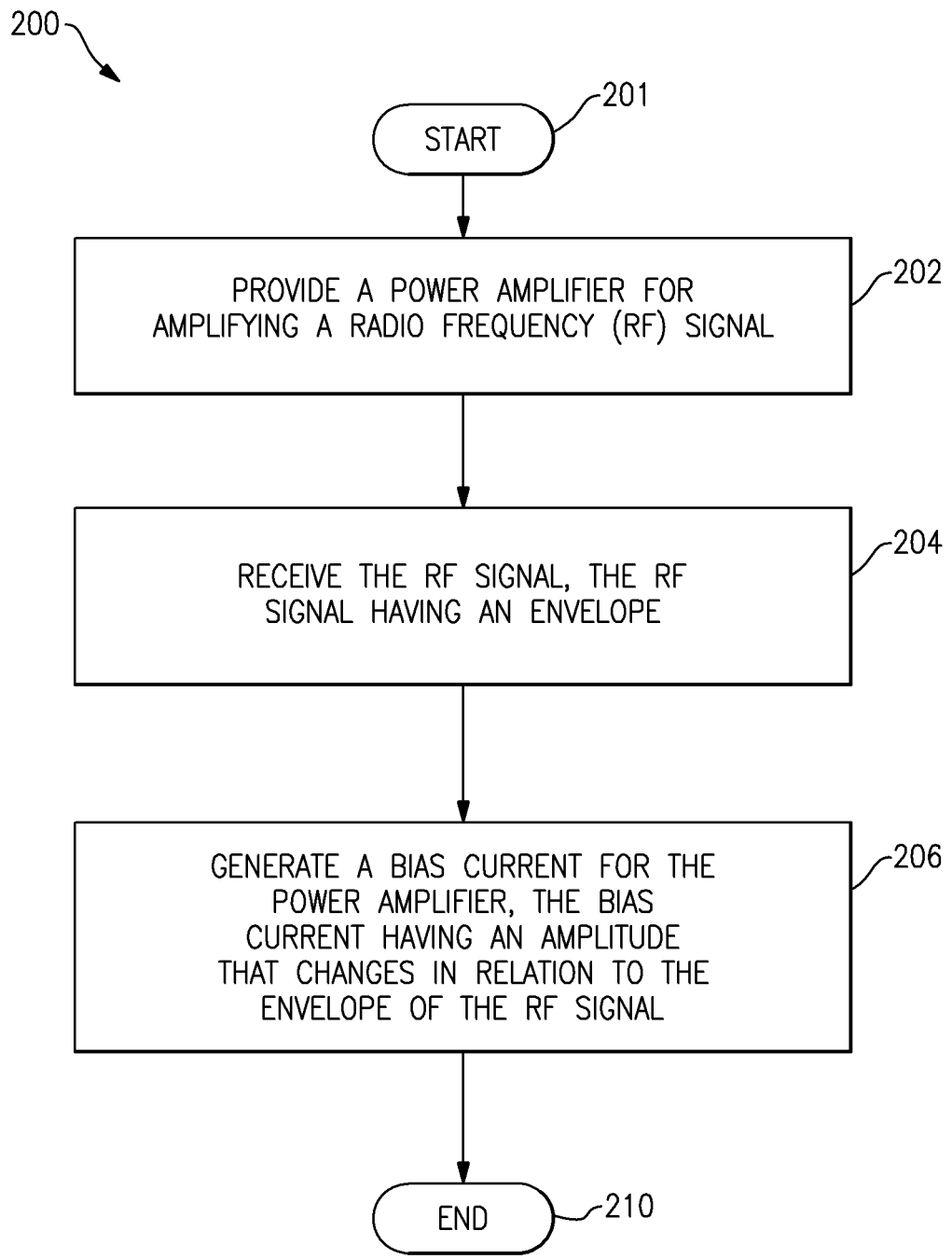
FIG. 7 illustrates a method of biasing a power amplifier according to one embodiment.

FIG. 7 illustrates a method 200 of biasing a power amplifier according to one embodiment. It will be understood that the methods discussed herein may include greater or fewer operations and the operations may be performed in any order, as necessary.

The method 200 of biasing a power amplifier starts at 201. In an ensuing block 202, a power amplifier is provided for amplifying an RF signal. The power amplifier can include one or more bipolar transistors, including HBT devices. The power amplifier can be a single stage or a multi-stage power amplifier.

In an ensuing block 204, the RF signal is received by the power amplifier. The RF signal has an envelope. The RF signal can represent a signal to be transmitted by the power amplifier using any of a variety of standards, including, for example, a GSM/EDGE, CDMA or W-CDMA based standard.

The method 200 continues at a block 206, in which a bias current is generated for the power amplifier. The bias current has an amplitude that varies in relation to the envelope of the RF signal. As was described earlier, providing a bias current to the power amplifier that varies or changes in relation to the envelope signal can be used to reduce power consumption of the power amplifier, thereby improving battery life and/or reducing heat dissipation of the power amplifier. The method ends at 210.

Applications

Some of the embodiments described above have provided examples in connection with mobile phones. However, the principles and advantages of the embodiments can be used for any other electronic system or apparatus that have needs for power amplifier systems.

Examples of such electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a power amplifier configured to amplify a radio frequency (RF) signal; and
a bias control circuit configured to generate a bias current for the power amplifier, the bias control circuit further configured to receive an envelope of the RF signal and to change an amplitude of the bias current based at least in part on the envelope, the bias control circuit including a converter for generating a reference signal using the envelope and a current mirror configured to receive the reference signal from the converter and to use the reference signal to generate the bias current, the reference signal having a shaping that, changes in relation to the envelope, the current mirror including a field-effect transistor having a gate, a source and a drain and a bipolar transistor having an emitter, a base and a collector, the gate of the field-effect transistor electrically connected to collector of the bipolar transistor and the source of the field-effect transistor electrically connected to the base of the bipolar transistor, the collector of the bipolar transistor and the gate of the field-effect transistor configured to receive the reference signal from the converter, and the source of the field-effect transistor configured to generate the bias current.

2. The power amplifier system of claim 1 wherein the reference signal from the converter is configured to operate as a bias voltage for the current mirror.

3. The power amplifier system of claim 1 wherein the drain of the field-effect transistor is electrically connected to a supply voltage, and the emitter of the bipolar transistor is electrically connected to a ground node.

4. The power amplifier system of claim 1 further comprising a delay element for delaying the envelope received by the bias control circuit.

5. The power amplifier system of claim 1 further comprising an envelope generator for generating the envelope and for providing the envelope to the bias control circuit.

6. The power amplifier system of claim 1 wherein the power amplifier includes a first stage and a second stage, the first stage configured to drive the second stage.

7. The power amplifier system of claim 6 wherein the bias current is used to bias the second stage of the power amplifier.

8. The power amplifier system of claim 1 wherein the power amplifier includes a bipolar transistor having a base configured to receive at least a portion of the bias current generated by the bias control circuit.

9. The power amplifier system of claim 8 wherein the transistor is a heterojunction bipolar transistor (HBT).

10. A method for biasing in an electronic system, the method comprising:
providing a power amplifier for amplifying a radio frequency (RF) signal;
receiving the RF signal into the power amplifier; and
generating a bias current for the power amplifier, the bias current having an amplitude that changes in relation to an envelope of the RF signal, wherein generating the bias current includes converting the envelope into a reference signal, the reference signal having a shaping that changes in relation to the envelope, and biasing a current mirror with the reference signal to generate the bias current, the current mirror including a field-effect transistor having a gate, a source and a drain and a bipolar transistor having an emitter, a base and a collector, the gate of the field-effect transistor electrically connected to collector of the bipolar transistor and the source of the field-effect transistor electrically connected to the base of the bipolar transistor, the collector of the bipolar transistor and the gate of the field-effect transistor configured to receive the reference signal, and the source of the field-effect transistor configured to generate the bias current.

11. The method of claim 10 further comprising delaying the envelope to control a delay between the bias current and the RF signal.

12. The method of claim 10 wherein generating the bias current for the power amplifier includes generating a base current for a bipolar transistor of the power amplifier.

13. A mobile device comprising:
a power amplifier configured to amplify a radio frequency (RF) signal;
a transceiver for providing the RF signal to the power amplifier;
a bias control circuit configured to generate a bias current for the power amplifier, the bias control circuit further configured to receive an envelope of the RF signal and to change an amplitude of the bias current based at least in part on the envelope, the bias control circuit including a converter for generating a reference signal using the envelope and a current mirror configured to receive the reference signal from the converter and to use the reference signal to generate the bias current, the reference signal having a shaping that changes in relation to the envelope; and an envelope generator for generating the envelope and for providing the envelope to the bias control circuit, the transceiver configured to provide at least one of an in-phase and a quadrature signal to the envelope generator to aid in generating the envelope.

14. The mobile device of claim 13 wherein the reference signal from the converter is configured to operate as a bias voltage for the current mirror.

15. The mobile device of claim 13 wherein the current mirror includes a field-effect transistor having a gate, a source and a drain and a bipolar transistor having an emitter, a base and a collector, the gate of the field-effect transistor electrically connected to collector of the bipolar transistor and the source of the field-effect transistor electrically connected to the base of the bipolar transistor, the collector of the bipolar transistor and the gate of the field-effect transistor configured to receive the reference signal from the converter, and the source of the field-effect transistor configured to generate the bias current.

16. The mobile device of claim 15 wherein the drain of the field-effect transistor is electrically connected to a supply voltage, and the emitter of the bipolar transistor is electrically connected to a ground node.

17. The mobile device of claim 13 further comprising a delay element for delaying the envelope received by the bias control circuit.

18. The mobile device of claim 13 wherein the power amplifier includes a first stage and a second stage, the first stage configured to drive the second stage, the second stage configure to receive the bias current.

19. The method of claim 10 further comprising generating the envelope using an envelope generator, and providing at least one of an in-phase and a quadrature signal to the envelope generator using a transceiver.

20. The method of claim 10 wherein the drain of the field-effect transistor is electrically connected to a supply voltage, and the emitter of the bipolar transistor is electrically connected to a ground node.

* * * * *